US012609507B2

(12) United States Patent
Imahigashi et al.

(10) Patent No.: US 12,609,507 B2
(45) Date of Patent: Apr. 21, 2026

(54) ELECTRONIC DEVICE

(71) Applicant: SONY SEMICONDUCTOR SOLUTIONS CORPORATION, Kanagawa (JP)

(72) Inventors: Takashi Imahigashi, Kumamoto (JP); Tsuyoshi Asakawa, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 534 days.

(21) Appl. No.: 18/006,004

(22) PCT Filed: Apr. 27, 2021

(86) PCT No.: PCT/JP2021/016765
§ 371 (c)(1),
(2) Date: Jan. 19, 2023

(87) PCT Pub. No.: WO2022/024484
PCT Pub. Date: Feb. 3, 2022

(65) Prior Publication Data
US 2024/0038706 A1     Feb. 1, 2024

(30) Foreign Application Priority Data

Jul. 27, 2020     (JP) ................................. 2020-126730

(51) Int. Cl.
*H01S 3/00*          (2006.01)
*H01S 5/0234*        (2021.01)
(Continued)

(52) U.S. Cl.
CPC .......... *H01S 5/0234* (2021.01); *H01S 5/0237* (2021.01); *H01S 5/042* (2013.01);
(Continued)

(58) Field of Classification Search
CPC ...... H01S 5/0234; H01S 5/0237; H01S 5/042; H01L 24/13
See application file for complete search history.

(56) References Cited

U.S. PATENT DOCUMENTS 5,666,270 A * 9/1997 Matsuda ................. H01L 24/81
                                                   361/705
5,829,125 A * 11/1998 Fujimoto ................ H01L 24/05
                                                   219/121.64
(Continued)

FOREIGN PATENT DOCUMENTS

EP          2405474 A1      1/2012
EP          2518784 B1      2/2018
(Continued)

OTHER PUBLICATIONS

International Search Report and Written Opinion prepared by the Japan Patent Office on Jul. 1, 2021, for International Application No. PCT/JP2021/016765, 3 pgs.

*Primary Examiner* — Kinam Park
(74) *Attorney, Agent, or Firm* — Sheridan Ross P.C.

(57) ABSTRACT

An electronic device according to the present disclosure includes a semiconductor substrate, a chip, and a bump. The chip has a thermal expansion coefficient different from that of the semiconductor substrate. The bump connects the connection pads provided on the opposing principal surfaces of the semiconductor substrate and the chip. The bump has a porous metal layer and a metal film. The metal film is provided on at least one of a portion between the connection pad provided on the semiconductor substrate and the porous metal layer and a portion between the connection pad provided on the chip and the porous metal layer, and on the side surfaces of the porous metal layer.

20 Claims, 5 Drawing Sheets

(51) Int. Cl.

| | | |
|---|---|---|
| *H01S 5/0237* | (2021.01) | |
| *H01S 5/042* | (2006.01) | |
| *H10W 72/00* | (2026.01) | |
| *H10W 72/20* | (2026.01) | |
| *H10W 72/90* | (2026.01) | |
| *H10W 90/00* | (2026.01) | |

(52) U.S. Cl.
CPC *H10W 72/01223* (2026.01); *H10W 72/01231* (2026.01); *H10W 72/01238* (2026.01); *H10W 72/01255* (2026.01); *H10W 72/01265* (2026.01); *H10W 72/221* (2026.01); *H10W 72/223* (2026.01); *H10W 72/245* (2026.01); *H10W 72/252* (2026.01); *H10W 72/255* (2026.01); *H10W 72/90* (2026.01); *H10W 90/722* (2026.01)

(56) References Cited

U.S. PATENT DOCUMENTS

| | | | | |
|---|---|---|---|---|
| 6,028,357 | A | 2/2000 | Moriyama | |
| 2009/0039507 | A1* | 2/2009 | Funaki | H01L 24/11 |
| | | | | 257/737 |
| 2010/0020264 | A1 | 1/2010 | Ohkawa | |
| 2010/0052163 | A1* | 3/2010 | Ouchi | H01L 21/563 |
| | | | | 257/737 |
| 2011/0192630 | A1 | 8/2011 | Ishino | |
| 2013/0001774 | A1* | 1/2013 | Masumori | H05K 3/3485 |
| | | | | 977/773 |
| 2013/0001775 | A1* | 1/2013 | Nishikubo | H01L 24/83 |
| | | | | 228/256 |
| 2013/0001803 | A1 | 1/2013 | Mengel | |
| 2013/0335940 | A1* | 12/2013 | Matsui | H01L 24/83 |
| | | | | 361/783 |
| 2016/0300808 | A1 | 10/2016 | Kuo | |
| 2018/0218990 | A1* | 8/2018 | Akutsu | H01L 24/11 |
| 2021/0376564 | A1* | 12/2021 | Imahigashi | G01S 17/894 |

FOREIGN PATENT DOCUMENTS

| | | |
|---|---|---|
| JP | H09-266230 | 10/1997 |
| JP | H11-168116 | 6/1999 |
| JP | 2006-005322 | 1/2006 |
| JP | 2010-028043 | 2/2010 |
| JP | 2011-077308 | 4/2011 |
| JP | 2016-018914 | 2/2016 |
| WO | WO 2011/114751 | 9/2011 |

* cited by examiner

ELECTRONIC DEVICE

CROSS REFERENCE TO RELATED APPLICATIONS

This application is a national stage application under 35 U.S.C. 371 and claims the benefit of PCT Application No. PCT/JP2021/016765, having an international filing date of 27 Apr. 2021, which designated the United States, which PCT application claimed the benefit of Japanese Patent Application No. 2020-126730, filed 27 Jul. 2020, the entire disclosures of each of which are incorporated herein by reference.

FIELD

The present disclosure relates to an electronic device.

BACKGROUND

As a technique for mounting a chip of an electronic component on a semiconductor substrate, for example, there is flip chip mounting in which a metal bump protruding from an upper surface of the semiconductor substrate and a connection pad provided on a lower surface of the chip are connected to each other while being overheated and tightly pressed against each other (see, for example, Patent Literature 1). Bulk gold, copper, solder, and the like are generally used as a material of the bump.

CITATION LIST

Patent Literature

Patent Literature 1: JP 2011-077308 A

SUMMARY

Technical Problem

However, when a chip having a thermal expansion coefficient different from that of the semiconductor substrate is flip-chip mounted on the semiconductor substrate using bulk gold or copper as a material of the bump, connection needs to be performed by the bump at a high temperature and a high pressure, which damages the chip and lowers the reliability of the electronic device.

On the other hand, when solder is used as the material of the bump, the semiconductor substrate and the chip can be connected to each other at a relatively low temperature and low pressure, but the connection strength is lower than that of the gold or copper bump. Therefore, the reliability is lowered in terms of the connection strength if the thermal expansion coefficient between the semiconductor substrate and the chip is different.

In addition, as electronic devices are miniaturized, using fine-pitch bumps to electrically connect the semiconductor substrate and the chip is an issue with flip mounting.

Therefore, the present disclosure proposes a highly reliable electronic device in which a chip having a thermal expansion coefficient different from that of a semiconductor substrate is flip-chip mounted on the semiconductor substrate by the fine-pitch bumps.

Solution to Problem

According to the present disclosure, An electronic device is provided. The electronic device according to the present disclosure includes a semiconductor substrate, a chip, and a bump. The chip has a thermal expansion coefficient different from that of the semiconductor substrate. The bump connects the connection pads provided on the opposing principal surfaces of the semiconductor substrate and the chip. The bump has a porous metal layer and a metal film. The metal film is provided on at least one of a portion between the connection pad provided on the semiconductor substrate and the porous metal layer and a portion between the connection pad provided on the chip and the porous metal layer, and on the side surfaces of the porous metal layer.

DESCRIPTION OF EMBODIMENTS

Figure 1:
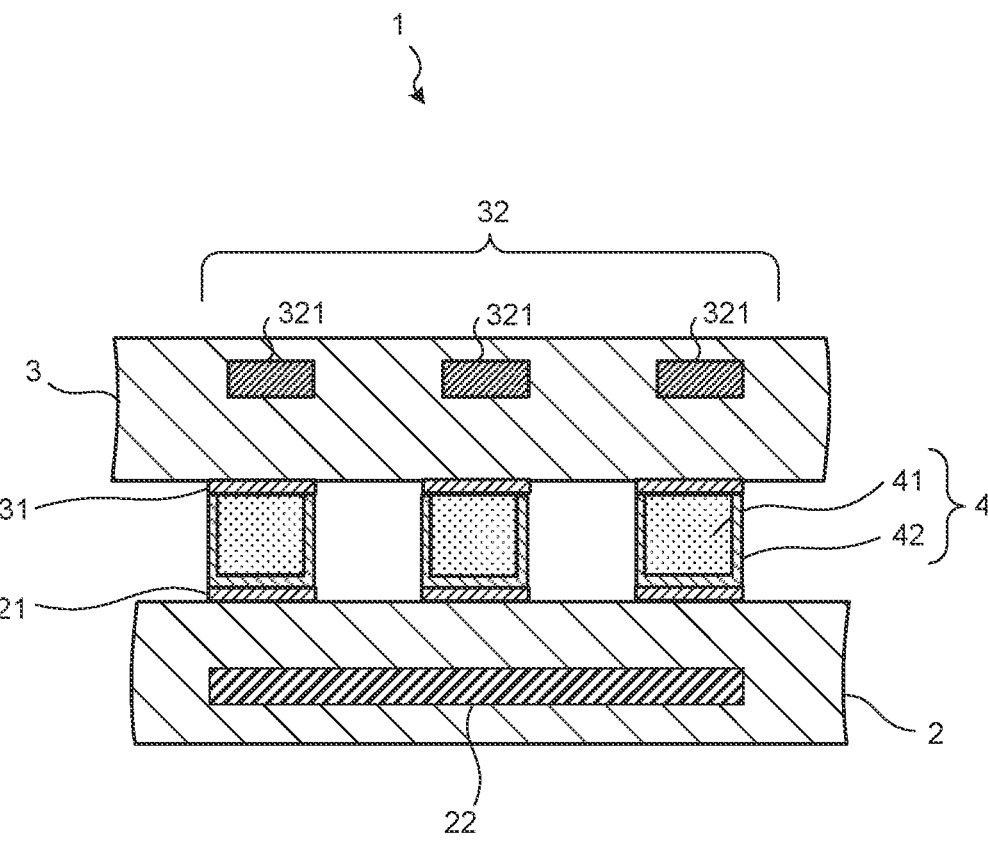
FIG. 1 is an explanatory view illustrating a cross section of an electronic device according to a present disclosure.

Hereinafter, embodiments of the present disclosure will be described in detail with reference to the drawings. Note that, in the following embodiments, the same parts are denoted by the same reference numerals and the same hatchings so that redundant description can be omitted.

[1. Cross-Sectional Structure of Electronic Device]

As illustrated in FIG. 1, an electronic device 1 according to the present disclosure includes a semiconductor substrate 2, a chip 3, and a connection portion that connects connection pads 21 and 31 provided on opposing principal surfaces of the semiconductor substrate 2 and the chip 3 (hereinafter referred to as a bump 4).

The chip 3 is, for example, a semiconductor laser in which the connection pad 31, and a light emitting unit 32 and the like of the semiconductor laser are formed inside a base material of gallium arsenide (GaAs). The light emitting unit 32 includes a plurality of light emitting elements 321 arranged two-dimensionally to emit laser light. Alternatively, the electronic component formed on the equipment of the chip 3 may be any electronic component other than the light emitting unit 32 of the semiconductor laser. In addition, the base material of the chip 3 may be, for example, a semi-insulating base material such as indium phosphide (InP).

The semiconductor substrate 2 is, for example, a silicon (Si) substrate inside which a drive circuit 22 that drives the semiconductor laser is formed. Alternatively, the electronic circuit formed inside the semiconductor substrate 2 may be any electronic circuit other than the drive circuit 22 of the semiconductor laser.

In the electronic device 1, the chip 3 is flip-chip mounted on the semiconductor substrate 2, and the drive circuit 22 in the semiconductor substrate 2 and the chip 3 that is a semiconductor laser are electrically connected to each other by the bump 4.

Here, in general flip-chip mounting, a chip is mounted on a semiconductor substrate by heating while tightly pressing a bulk bump made of metal such as gold (Au), copper (Cu), or solder provided on an opposing principal surface of the semiconductor substrate or the chip.

However, if the thermal expansion coefficients of the semiconductor substrate and the chip are different from each other by, for example, 0.1 ppm/° C. or more, the following problems occur when the bulk Au, Cu, solder, or the like is used as the material of the bump.

For example, when the bulk Au is used as the material of the bump, it is necessary to heat the bump to a high temperature of 300° C. or more and apply a high pressure of 100 MPa or more between the semiconductor substrate and the chip, in order that the semiconductor substrate and the chip having different thermal expansion coefficients are stably connected to each other by the bump.

When the bulk Cu is used as the material of the bump, it is necessary to heat the bump to 380° C. or higher is required. Thus, when the bulk Au or Cu is used as the material of the bump, connection by the bump needs to be performed at a high temperature and a high pressure, and such a high temperature and a high pressure may damage the chip, which may lower the reliability of the electronic device.

On the other hand, when solder is used as the material of the bump, connection by the bump can be performed at a low temperature and a low pressure as compared with Au and Cu, but the solder is inferior in heat resistance and connection strength to Au and Cu. For this reason, in the case of the solder bump, for example, when the chip thermally expands due to heat generation of the electronic component such as the semiconductor laser mounted on the chip, an open failure may occur due to the difference in thermal expansion coefficient between the semiconductor substrate and the chip, which may lower the reliability of the electronic device.

Here, as described above, the semiconductor substrate 2 according to the present disclosure is a Si substrate, which has a thermal expansion coefficient of 5.7 ppm/° C. On the other hand, the base material of the chip 3 according to the present disclosure is GaAs, which has a thermal expansion coefficient of 2.6 ppm/° C.

Thus, in the electronic device 1, the difference in thermal expansion coefficient between the semiconductor substrate 2 and the chip 3 is much larger than 0.1 ppm/° C. For this reason, in the electronic device 1, when the material of the bump is the bulk Au, Cu, or solder, the above-described problems may occur and the reliability may be lowered.

To solve this issue, the bump 4 of the electronic device 1 includes a porous metal layer 41 of Au, for example. The porous metal layer 41 contains Au particles having a particle diameter of 0.005 μm to 1.0 μm. Alternatively, the ingredient of the porous metal layer 41 may be, for example, Cu, silver (Ag), or platinum (Pt).

The porous metal layer 41 containing metal particles having a particle diameter of 0.005 μm to 1.0 μm can be metal-bonded at a temperature lower than the melting point of the bulk metal due to the size effect of the particle diameter. For example, the porous metal layer 41 can connect the semiconductor substrate 2 and the chip 3 at a temperature of about 100° C. when the ingredient is Au, about 250° C. when the ingredient is Ag, and about 150° C. when the ingredient is Cu. This allows the electronic device 1 to reduce damage to the chip 3 due to heat, and thus improve the reliability.

In addition, the porous metal layer 41 has elasticity, and thus elastically deforms, for example, even if the chip 3 expands with a thermal expansion coefficient different from that of the semiconductor substrate 2 due to heat generation of the semiconductor laser, which can suppress the occurrence of an open failure. This allows the electronic device 1 to improve the reliability as compared with, for example, a case where a solder bump is used.

The electronic device 1 is manufactured by stacking the chip 3 on the semiconductor substrate 2 provided with the bump 4 on the upper surface, connecting the porous metal layer 41 of the bump 4 to the connection pad 31 without melting the porous metal layer 41, and flip-chip mounting the chip 3 on the semiconductor substrate 2.

Alternatively, the electronic device 1 may be manufactured by stacking the chip 3 provided with the bump including the porous metal layer 41 on the lower surface on the semiconductor substrate 2, connecting the porous metal layer 41 of the bump to the connection pad 21 without melting the porous metal layer 41, and flip-chip mounting the chip 3 on the semiconductor substrate 2. The bump may be provided on both the semiconductor substrate 2 and the chip 3 before stacking.

When provided on the semiconductor substrate 2 side, the bump 4 includes a metal film 42 between the porous metal layer 41 and the connection pad 21 on the semiconductor substrate 2 side. When provided on the chip 3 side, the bump includes the metal film 42 between the porous metal layer 41 and the connection pad 31 on the chip 3 side.

In the present disclosure, the ratio of the film thickness of the metal film 42 to the thickness of the bump 4 in the direction orthogonal to the principal surface of the semiconductor substrate 2 is set to less than 10%, thereby allowing the bumps 4 to have a fine pitch of 20 μm or less. Such a fine pitch will be described later together with a formation process of the bumps 4.

Further, the bump 4 includes the metal film 42 also on the side surfaces (side peripheral surfaces) of the porous metal layer 41. The material of the metal film 42 is desirably the same as that of the porous metal layer 41. For example, when the material of the porous metal layer 41 is Au, the metal film 42 is desirably an Au film.

With this configuration, since the side surfaces of the porous metal layer 41 of the bump 4 are coated with the metal film 42, it is possible to prevent the particles of the porous metal layer 41 from collapsing and scattering. Therefore, the bump 4 can prevent short-circuit between adjacent bumps 4, which occurs when the particles of the porous metal layer 41 scatter.

In addition, when the metal film 42 is not provided on the side surfaces of the porous metal layer 41, surface roughness occurs on the side surfaces of the porous metal layer 41 whose surface is relatively soft, and the shape varies among the bumps 4.

On the other hand, when the metal film 42 harder than the porous metal layer 41 is provided on the side surfaces of the porous metal layer 41 of the bump 4, the shape variations among the bumps 4 are suppressed, and thus all the bumps 4 have a uniform shape. Moreover, since the side surfaces of the bump 4 are coated with the relatively hard porous metal layer 41, the bump 4 can be further miniaturized, thus allowing the bumps 4 to have a further fine pitch.

In addition, the bump 4 is slightly crushed in the thickness direction when the chip 3 is flip-chip mounted on the semiconductor substrate 2, but the particles of the porous metal layer 41 are prevented from leaking to the outside of the metal film 42. As a result, the particle density of the porous metal layer 41 inside the metal film 42 increases in the bump 4, which can reduce the connection resistance.

[2. Bump Forming Process]

Next, a bump forming process according to the present disclosure will be described with reference to FIGS. 2A to 3D. FIGS. 2A to 2D are explanatory views illustrating a process for forming the bump 4 on the semiconductor substrate 2 according to the present disclosure. FIGS. 3A to 3D are explanatory views illustrating a process for forming a bump 4a (see FIG. 3D) on the chip 3 according to the present disclosure.

Figure 2A:
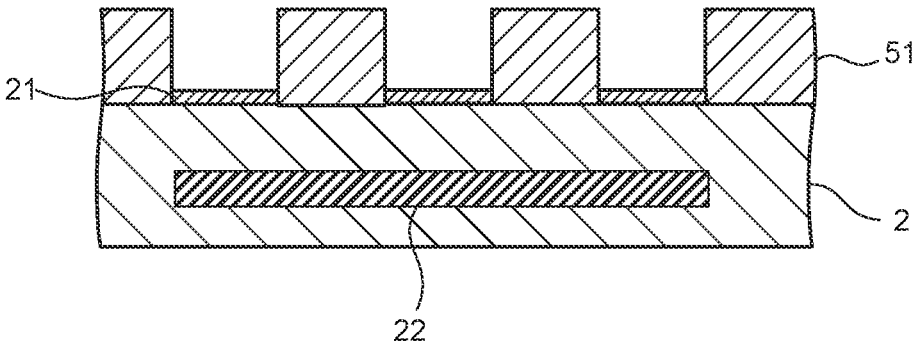
FIG. 2A is an explanatory view illustrating a process for forming a bump on a semiconductor substrate according to the present disclosure.

As illustrated in FIG. 2A, in the case of forming the bump 4 on the semiconductor substrate 2, first, a photoresist layer 51 is formed on the surface of the semiconductor substrate 2 on the side where the connection pad 21 is provided. Then, a through hole is formed at a position on the photoresist layer 51 where the bump 4 is to be formed later by a photolithography technique to expose the surface of the connection pad 21.

At this time, the through hole is formed such that an interval between the centers of adjacent through holes is 20 μm (20 μm pitch). The through hole is filled with a paste 40 containing metal particles to be used as a material of the porous metal layer 41 in a subsequent step, but since the structure is fine with a 20 μm pitch, the fine structure may be damaged and collapse if the through hole is filled with the paste 40 without making any change.

Figure 2B:
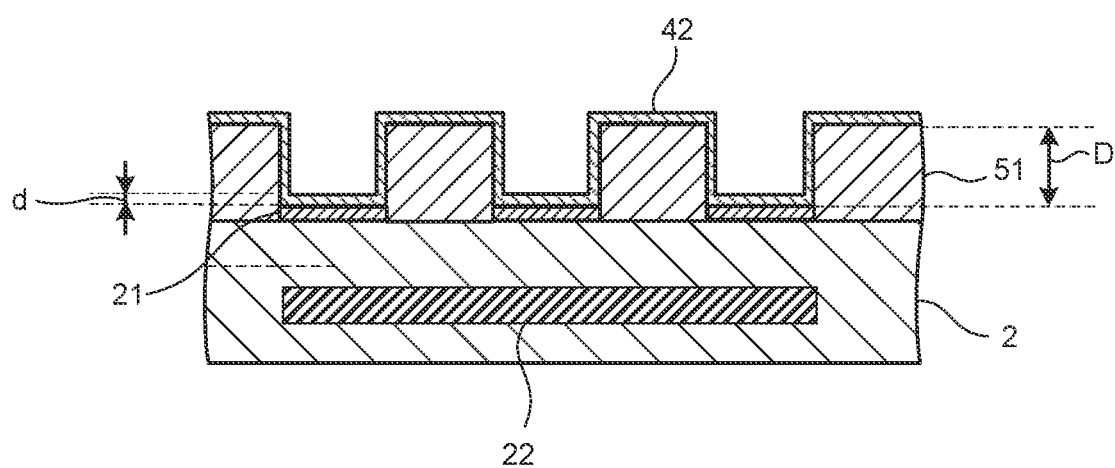
FIG. 2B is an explanatory view illustrating a process for forming the bump on the semiconductor substrate according to the present disclosure.

Then, as illustrated in FIG. 2B, the metal film 42 is formed on the upper surface of the photoresist layer 51, the side surfaces of the through hole, and the upper surface of the connection pad 21 by sputtering, for example. As the material of the metal film 42, a metal having the same ingredient as the metal particles contained in the paste 40 to be put into the through hole later is selected. Here, the Au metal film 42 is formed.

With this configuration, the photoresist layer 51 is hardened while its surface is coated with the metal film 42, which can prevent the fine structure from collapsing when the through hole is filled with the paste 40 containing the metal particles.

In addition, if the thickness of the metal film 42 formed here is too large, the opening of the through hole is narrow, making it difficult to fill the through hole with the paste 40 containing the metal particles. To counter this, here, the thin metal film 42 (with a thickness of less than 1 μm, for example) is formed such that the ratio of a film thickness d of the metal film 42 to a depth D of the through hole, in other words, the thickness of the bump 4 to be formed later in the direction orthogonal to the principal surface of the semiconductor substrate 2 (a height D of the bump 4) is less than 10%.

For example, when the bump 4 arrayed at a 20 μm pitch and having a 10 μm height is formed, the film thickness of the metal film 42 is set to 0.2 μm. This can prevent the opening of the through hole from being narrowed even when the metal film 42 is formed, thus allowing the through hole to be sufficiently filled with the paste 40 containing the metal particles in a subsequent step.

Figure 2C:
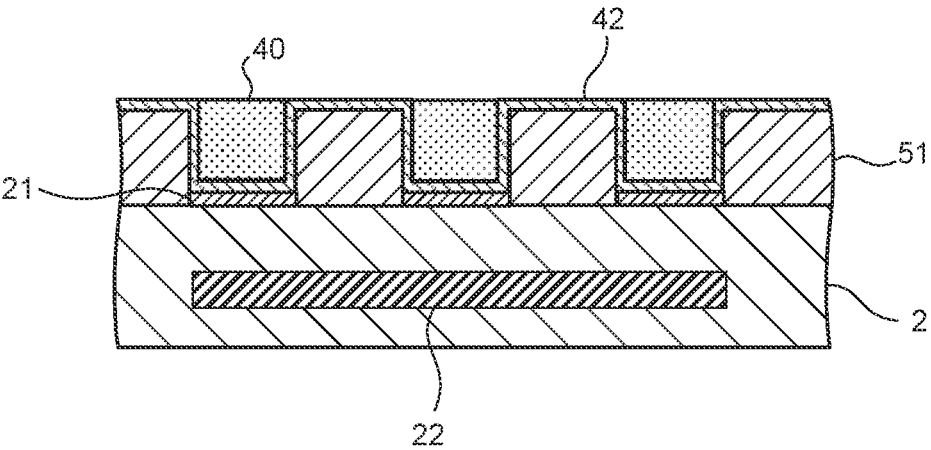
FIG. 2C is an explanatory view illustrating a process for forming the bump on the semiconductor substrate according to the present disclosure.

Subsequently, as illustrated in FIG. 2C, the through hole formed in the photoresist layer 51 is filled with the paste 40 containing, for example, Au particles having a purity of 99.9 wt % or more and a particle diameter of 0.005 μm to 1.0 μm. As a method of filling the through hole with the paste 40, for example, any method such as screen printing or spreading the dropped paste 40 with a spatula may be used.

Figure 2D:
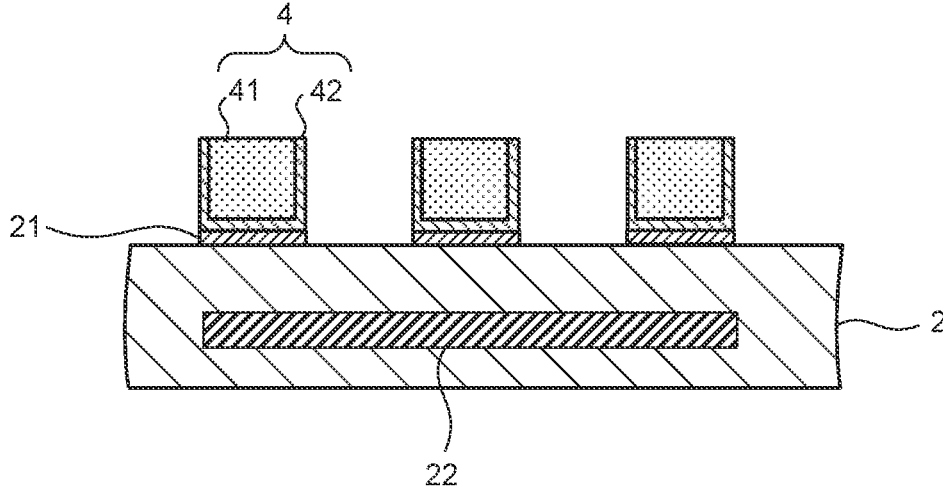
FIG. 2D is an explanatory view illustrating a process for forming the bump on the semiconductor substrate according to the present disclosure.

Then, the paste 40 is dried and sintered, and subsequently the photoresist layer 51 is peeled off by lift-off using a peeling solution or the like. Thus, as illustrated in FIG. 2D, the bump 4 is completed in which the Au metal film 42 and the porous metal layer 41 containing the Au particles having a particle diameter of 0.005 μm to 1.0 μm are sequentially stacked on the surface of the connection pad 21, and further, the metal film 42 is formed also on the side surfaces of the porous metal layer 41.

In this manner, the bump 4 includes the metal film 42 in which the ratio of the film thickness to the height of the bump 4 is less than 10%, between the connection pad 21 and the porous metal layer 41. Further, the bump 4 is provided with the metal film 42 also on the side surfaces of the porous metal layer 41.

The metal film 42 is formed on the upper surface of the photoresist layer 51, the side surfaces of the through hole formed in the photoresist layer 51, and the surface of the connection pad 21 to prevent the fine structure of the bump 4 patterned on the photoresist layer 51 from collapsing. This enables the bumps 4 to have a fine pitch of 20 μm or less.

In addition, since the metal film 42 is formed on the surface of the connection pad 21 by sputtering, the metal film 42 is firmly bonded to the connection pad 21 even if the connection pad 21 is a metal having an ingredient different from that of the metal film 42.

Further, although the metal film 42 may be formed of a metal having an ingredient different from that of the porous metal layer 41 stacked on the surface, if the metal film 42 is formed of Au, which is the same ingredient, the porous metal layer 41 is bonded to the metal film 42 with a stronger bonding force than when it is provided on another metal film having a different ingredient. Alternatively, when the bump 4 has an ingredient other than Au (for example, Cu, Ag (silver), or Pt (platinum)), an ingredient other than Au (for example, Cu, Ag (silver), or Pt (platinum)) may be used for the metal film 42 as well.

Figure 3A:
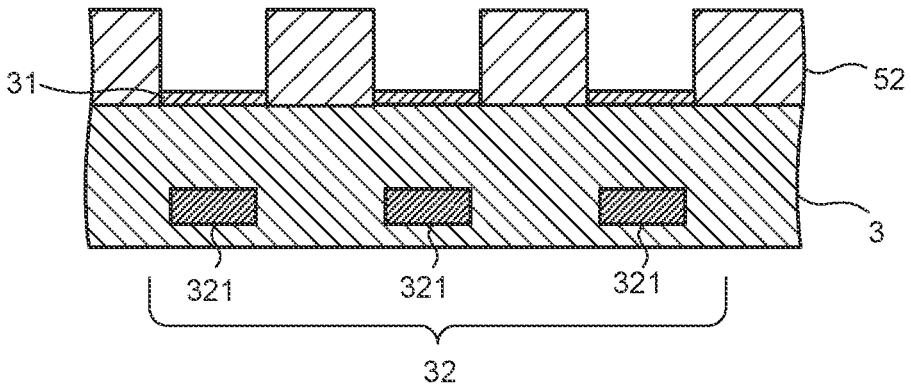
FIG. 3A is an explanatory view illustrating a process for forming a bump on a chip according to the present disclosure.

Next, a process for forming the bump 4a illustrated in FIG. 3D on the chip 3 will be described. As illustrated in FIG. 3A, in the case of forming the bump 4a on the chip 3, first, a photoresist layer 52 is formed on the surface of the chip 3 on the side where the connection pad 31 is provided. Then, a through hole is formed at a position on the photoresist layer 52 where the bump 4a is to be formed later by a photolithography technique to expose the surface of the connection pad 31.

Figure 3B:
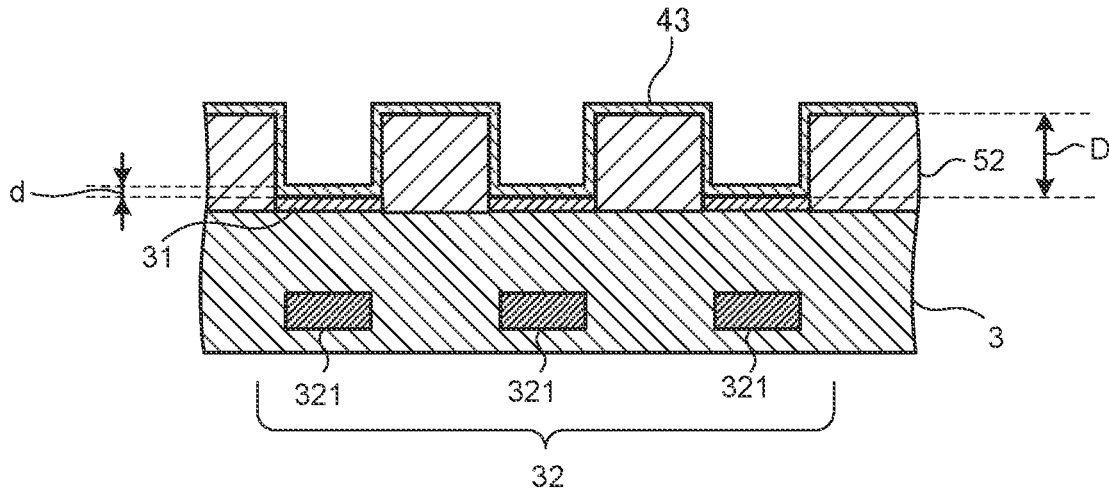
FIG. 3B is an explanatory view illustrating a process for forming the bump on the chip according to the present disclosure.

Then, as illustrated in FIG. 3B, a metal film 43 is formed on the upper surface of the photoresist layer 52, the side surfaces of the through hole, and the upper surface of the connection pad 31 by sputtering, for example. As the material of the metal film 43, Au having the same ingredient as the Au particles contained in the paste 40 to be put into the through hole later is selected.

With this configuration, the photoresist layer 52 is hardened while its surface is coated with the metal film 43, which can prevent the fine structure from collapsing when the through hole is filled with the paste 40 containing the Au particles.

Here, too, the thin metal film 43 (with a thickness of less than 1 μm, for example) is formed such that the ratio of a film thickness d of the metal film 43 to a depth D of the through hole, in other words, the thickness of the bump 4*a* to be formed later in the direction orthogonal to the principal surface of the chip 3 (a height D of the bump 4*a*) is less than 10%.

For example, as in the bump 4 on the semiconductor substrate 2 side, when the bump arrayed at a 20 μm pitch and having a 10 μm height is formed, the film thickness of the metal film 43 is set to 0.2 μm. This can prevent the opening of the through hole from being narrowed even when the metal film 43 is formed, thus allowing the through hole to be sufficiently filled with the paste 40 containing the Au particles in a subsequent step.

Figure 3C:
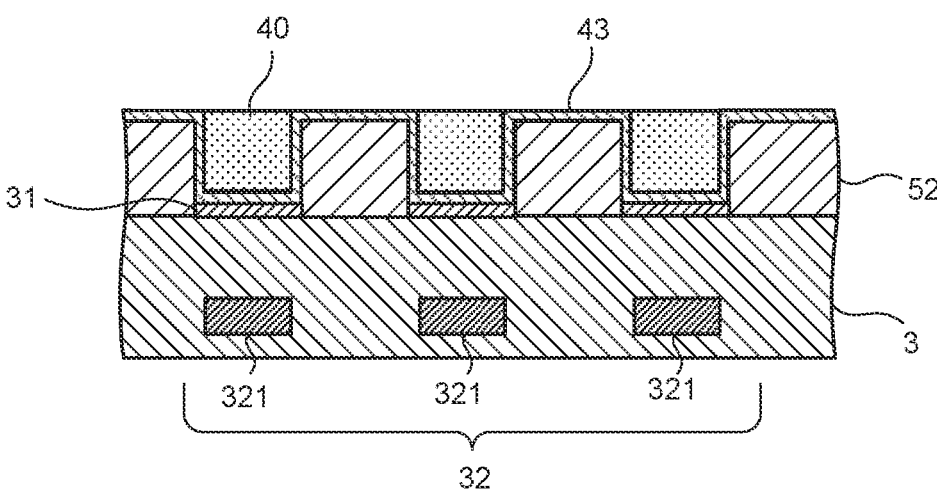
FIG. 3C is an explanatory view illustrating a process for forming the bump on the chip according to the present disclosure.
Figure 3D:
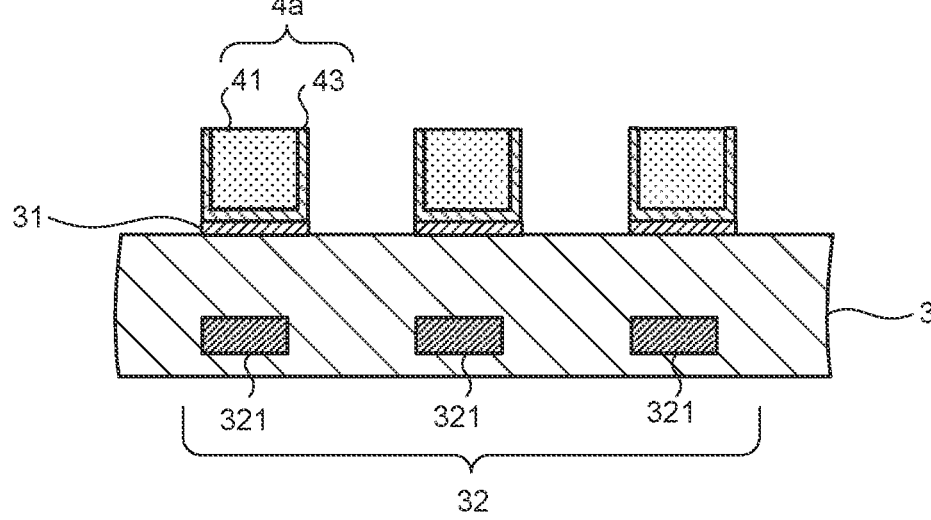
FIG. 3D is an explanatory view illustrating a process for forming the bump on the chip according to the present disclosure.

Subsequently, as illustrated in FIG. 3C, the through hole formed in the photoresist layer 52 is filled with the paste 40 containing, for example, Au particles having a purity of 99.9 wt % or more and a particle diameter of 0.005 μm to 1.0 μm.

Then, the paste 40 is dried and sintered, and subsequently the photoresist layer 52 is peeled off using a peeling solution or the like. Thus, as illustrated in FIG. 3D, the bump 4*a* is completed in which the Au metal film 43 and the porous metal layer 41 containing the Au particles having a particle diameter of 0.005 μm to 1.0 μm are sequentially stacked on the surface of the connection pad 31, and further, the metal film 43 is formed also on the side surfaces of the porous metal layer 41.

In this manner, the bump 4*a* includes the metal film 43 in which the ratio of the film thickness to the height of the bump 4*a* is less than 10%, between the connection pad 31 and the porous metal layer 41. Further, the bump 4*a* is provided with the metal film 43 also on the side surfaces of the porous metal layer 41. This enables the bumps 4*a* to have a fine pitch of 20 m or less, as in the bumps 4 on the semiconductor substrate 2 side.

In addition, in the bump 4*a*, the metal film 43 and the connection pad 31 can be firmly bonded, and the metal film 43 and the porous metal layer 41 can be firmly bonded, as in the bump 4 on the semiconductor substrate 2 side.

In the above-described embodiment, description has been given for the case where the chip 3 not provided with the bump 4*a* is mounted on the semiconductor substrate 2 provided with the bump 4, and the case where the chip 3 provided with the bump 4*a* is mounted on the semiconductor substrate 2 not provided with the bump 4; however, these cases are an example.

The electronic device according to the present disclosure may have a configuration in which the chip 3 provided with the bumps 4*a* is mounted on the semiconductor substrate 2 provided with the bump 4. In the case of such a configuration, the ratio of the film thickness of the metal film 42, 43 to half of the thickness of the stacked body of the bumps 4 and 4*a*, which serves as a connection portion connecting the semiconductor substrate 2 and the chip 3, in the direction orthogonal to the principal surfaces of the semiconductor substrate 2 and the chip 3 is less than 10%, preferably less than 5%.

In addition, in the above-described embodiment, description has been given for the case where the base material of the chip 3 is a base material other than Si; however, the base material of the chip 3 may be Si doped with impurities as long as the thermal expansion coefficient is different from that of the semiconductor substrate 2.

The chip 3 including the light emitting unit 32 of the semiconductor laser and the semiconductor substrate 2 including the drive circuit 22 of the semiconductor laser as described above are mounted on, for example, a distance measuring device such as a ToF sensor or a structured light device. When mounted on the distance measuring device, the light emitting unit 32 of the semiconductor laser functions as, for example, a light source of the ToF sensor or a light source of the structured light device.

[3. Effects]

The electronic device 1 includes the semiconductor substrate 2, the chip 3, and the connection portion (bump 4). The chip 3 has a thermal expansion coefficient different from that of the semiconductor substrate 2. The bump 4 includes the porous metal layer 41 that connects the connection pads 21 and 31 provided on the opposing principal surfaces of the semiconductor substrate 2 and the chip 3. The electronic device 1 includes the semiconductor substrate 2, the chip 3, and the bump 4, 4*a*. The chip 3 has a thermal expansion coefficient different from that of the semiconductor substrate 2. The bump 4, 4*a* connects the connection pads 21 and 31 provided on the opposing principal surfaces of the semiconductor substrate 2 and the chip 3. The bump 4, 4*a* has the porous metal layer 41 and the metal film 42, 43. The metal film 42, 43 is provided on at least one of a portion between the connection pad 21 provided on the semiconductor substrate 2 and the porous metal layer 41 and a portion between the connection pad 31 provided on the chip 3 and the porous metal layer 41, and on the side surfaces of the porous metal layer 41.

With this configuration, the electronic device 1 can connect the connection pads 21 and 31 of the semiconductor substrate 2 and the chip 3 by low-temperature and low-pressure processing, as compared with the case where the connection pads 21 and 31 of the semiconductor substrate 2 and the chip 3 are connected to each other by a bulk metal bump. In addition, the electronic device 1 can prevent collapse of the porous metal layer 41 using the metal films 42 and 43 provided on the side surfaces of the porous metal layer 41. Therefore, the electronic device 1 is a highly reliable electronic device in which the chip 3 having a thermal expansion coefficient different from that of the semiconductor substrate 2 is flip-chip mounted on the semiconductor substrate 2 by the fine-pitch bumps 4, 4*a*.

In addition, the chip 3 has a thermal expansion coefficient different from that of the semiconductor substrate 2 by 0.1 ppm/° C. or more. Even if this causes the chip 3 of the electronic device 1 to be heated and expand with a thermal expansion coefficient different from that of the semiconductor substrate 2, the porous metal layer 41 elastically deforms, thus making it possible to suppress the occurrence of an open failure in the bump 4.

The chip 3 is a semiconductor laser, and the semiconductor substrate 2 has the drive circuit 22 that drives the semiconductor laser. Even if this causes the chip 3 of the electronic device 1 to expand with a thermal expansion coefficient different from that of the semiconductor substrate 2 due to heat generation associated with light emission of the semiconductor laser, the porous metal layer 41 elastically deforms, thus making it possible to suppress the occurrence of an open failure in the bump 4.

The porous metal layer 41 contains the metal particles having a particle diameter of 0.005 μm to 1.0 μm. The porous metal layer 41 can be metal-bonded at a temperature lower than the melting point of the bulk metal due to the size effect of the metal particles. This allows the electronic device 1 to connect the connection pads 21 and 31 of the semiconductor substrate 2 and the chip 3 using the porous metal layer 41 that can be metal-bonded at a relatively low temperature, and thus to reduce damage due to heat and improve the reliability.

In the metal film 42, 43 provided between the connection pad 21, 31 and the porous metal layer 41, the ratio of the film thickness to the thickness of the bump 4, 4a in the direction orthogonal to the principal surfaces of the semiconductor substrate 2 and the chip 3 is less than 10%. This can prevent the through holes for forming the bump 4, 4a patterned on the photoresist layer 51, 52 from being narrowed due to the formation of the metal film 42, 43. As a result, the through hole patterned in the photoresist layer 51, 52 can be appropriately filled with the paste 40 containing the metal particles to be used as the material of the bump 4, 4a.

In the case of the electronic device in which the semiconductor substrate 2 and the chip 3 are connected to each other by the bumps 4 and 4a, the ratio of the film thickness of the metal film 42, 43 provided between the connection pad 21, 31 and the porous metal layer 41 to half of the thickness of the bump 4a in the direction orthogonal to the principal surfaces of the semiconductor substrate 2 and the chip 3 is less than 10%. This can prevent the through holes for forming the bump 4, 4a patterned on the photoresist layer 51, 52 from being narrowed due to the formation of the metal film 42, 43. As a result, the through hole patterned in the photoresist layer 51, 52 can be appropriately filled with the paste 40 containing the metal particles to be used as the material of the bump 4, 4a.

The electronic device 1 includes the semiconductor substrate 2 and the bump 4. The bump 4 is provided on the surface of the connection pad 21 provided on the principal surface of the semiconductor substrate 2. The bump 4 has the porous metal layer 41 and the metal film 42. The metal film 42 is provided between the porous metal layer 41 and the connection pad 21 and on the side surfaces of the porous metal layer 41. The ratio of the film thickness of the metal film 42 to the thickness of the bump 4 in the direction orthogonal to the principal surface of the semiconductor substrate 2 is less than 10%.

This allows the bumps 4 on the semiconductor substrate 2 to have a fine pitch, and allows the chip 3 having a thermal expansion coefficient different from that of the semiconductor substrate 2 to be flip-chip mounted by low-temperature and low-pressure processing as compared with the case where the bulk metal bump is used.

The electronic device 1 includes the chip 3 and the bump 4a. The bump 4a is provided on the surface of the connection pad 31 provided on the principal surface of the chip 3. The bump 4a has the porous metal layer 41 and the metal film 43. The metal film 43 is provided between the porous metal layer 41 and the connection pad 31 and on the side surfaces of the porous metal layer 41. The ratio of the film thickness of the metal film 42 to the thickness of the bump 4a in the direction orthogonal to the principal surface of the chip 3 is less than 10%.

This allows the bumps 4a on the chip 3 to have a fine pitch, and allows the chip 3 to be flip-chip mounted on semiconductor substrate 2 having a thermal expansion coefficient different from that of the chip 3 by low-temperature and low-pressure processing as compared with the case where the bulk metal bump is used.

The effects described herein are merely examples and are not subject to limitations, and other effects may be provided.

The present technique may also have the following configurations.

(1)
An electronic device including:

a semiconductor substrate;
a chip having a thermal expansion coefficient different from that of the semiconductor substrate; and
a bump that connects connection pads provided on opposing principal surfaces of the semiconductor substrate and the chip, wherein the bump includes:
a porous metal layer; and
a metal film provided on at least one of a portion between the connection pad provided on the semiconductor substrate and the porous metal layer and a portion between the connection pad provided on the chip and the porous metal layer, and on side surfaces of the porous metal layer.

(2)
The electronic device according to (1), wherein
the chip has
a thermal expansion coefficient different from that of the semiconductor substrate by 0.1 ppm/° C. or more.

(3)
The electronic device according to (1) or (2), wherein
the chip is
a semiconductor laser, and
the semiconductor substrate has
a drive circuit that drives the semiconductor laser.

(4)
The electronic device according to any one of (1) to (3), wherein
the porous metal layer contains
metal particles having a particle diameter of 0.005 $\mu$m to 1.0 $\mu$m.

(5)
The electronic device according to any one of (1) to (4), wherein
a ratio of a film thickness of the metal film provided between the connection pad and the porous metal layer to a thickness of the bump in the direction orthogonal to the principal surface is less than 10%.

(6)
The electronic device according to any one of (1) to (4), wherein,
a ratio of a film thickness of the metal film provided between the connection pad and the porous metal layer to half of the thickness of the bump in the direction orthogonal to the principal surface is less than 10%.

(7)
An electronic device including:
a semiconductor substrate; and
a bump provided on a surface of a connection pad provided on a principal surface of the semiconductor substrate, wherein
the bump includes:
a porous metal layer; and
a metal film provided between the porous metal layer and the connection pad and on side surfaces of the porous metal layer, and
a ratio of a film thickness of the metal film to a thickness of the bump in a direction orthogonal to the principal surface is less than 10%.

(8)
An electronic device including:
a chip; and
a bump provided on a surface of a connection pad provided on a principal surface of the chip, wherein
the bump includes:
a porous metal layer; and a metal film provided between the porous metal layer and the connection pad and on side surfaces of the porous metal layer, and a ratio of a film thickness of the metal film to a thickness of the bump in a direction orthogonal to the principal surface is less than 10%.

REFERENCE SIGNS LIST

1 ELECTRONIC DEVICE
2 SEMICONDUCTOR SUBSTRATE
21 CONNECTION PAD
22 DRIVE CIRCUIT
3 CHIP
31 CONNECTION PAD
32 LIGHT EMITTING UNIT
321 LIGHT EMITTING ELEMENT
4 BUMP
4a BUMP
41 POROUS METAL LAYER
42 METAL FILM
43 METAL FILM

What is claimed is:

1. An electronic device, comprising:
a semiconductor substrate;
a chip having a thermal expansion coefficient different from that of the semiconductor substrate; and
a bump that connects connection pads provided on opposing principal surfaces of the semiconductor substrate and the chip,
wherein the bump includes:
    a porous metal layer; and
    a metal film provided on at least one of a portion between the connection pad provided on the semiconductor substrate and the porous metal layer and a portion between the connection pad provided on the chip and the porous metal layer, and on side surfaces of the porous metal layer.

2. The electronic device according to claim 1, wherein the chip has a thermal expansion coefficient different from that of the semiconductor substrate by 0.1 ppm/° C. or more.

3. The electronic device according to claim 1, wherein the chip is a semiconductor laser, and the semiconductor substrate has a drive circuit that drives the semiconductor laser.

4. The electronic device according to claim 1, wherein the porous metal layer contains metal particles having a particle diameter of 0.005 μm to 1.0 μm.

5. The electronic device according to claim 1, wherein a ratio of a film thickness of the metal film provided between the connection pad and the porous metal layer to a thickness of the bump in a direction orthogonal to the principal surface is less than 10%.

6. The electronic device according to claim 1, wherein, a ratio of a film thickness of the metal film provided between the connection pad and the porous metal layer to half of the thickness of the bump in a direction orthogonal to the principal surface is less than 10%.

7. An electronic device, comprising:
a semiconductor substrate; and a bump provided on a surface of a connection pad provided on a principal surface of the semiconductor substrate,
wherein the bump includes:
    a porous metal layer; and
    a metal film provided between the porous metal layer and the connection pad and on side surfaces of the porous metal layer, and
    a ratio of a film thickness of the metal film to a thickness of the bump in a direction orthogonal to the principal surface is less than 10%.

8. An electronic device, comprising:
a chip; and
a bump provided on a surface of a connection pad provided on a principal surface of the chip,
wherein the bump includes:
    a porous metal layer; and
    a metal film provided between the porous metal layer and the connection pad and on side surfaces of the porous metal layer, and
    a ratio of a film thickness of the metal film to a thickness of the bump in a direction orthogonal to the principal surface is less than 10%.

9. The electronic device according to claim 8, wherein the chip is a semiconductor laser.

10. The electronic device according to claim 9, wherein the semiconductor laser includes a light emitting unit formed inside a based material of gallium arsenide.

11. The electronic device according to claim 10, wherein the light emitting unit includes a plurality of light emitting elements.

12. The electronic device according to claim 9, wherein the semiconductor laser includes a light emitting unit formed inside a based material of indium phosphide.

13. The electronic device according to claim 8, wherein the porous metal layer contains metal particles including gold, silver, platinum or copper.

14. The electronic device according to claim 3, wherein the semiconductor laser includes a light emitting unit formed inside a based material of gallium arsenide.

15. The electronic device according to claim 14, wherein the light emitting unit includes a plurality of light emitting elements.

16. The electronic device according to claim 3, wherein the semiconductor laser includes a light emitting unit formed inside a based material of indium phosphide.

17. The electronic device according to claim 4, wherein the metal particles include gold, silver, platinum or copper.

18. The electronic device according to claim 7, wherein the semiconductor substrate has a thermal expansion coefficient of 5.7 ppm/° C.

19. The electronic device according to claim 7, wherein the porous metal layer contains metal particles including gold, silver, platinum or copper.

20. The electronic device according to claim 7, wherein the porous metal layer contains metal particles having a particle diameter of 0.005 μm to 1.0 μm.

* * * * *